(12) United States Patent  
Deguenther et al.

(10) Patent No.: US 9,091,945 B2  
(45) Date of Patent: Jul. 28, 2015

(54) ILLUMINATION SYSTEM OF A MICROLITHOGRAPHIC PROJECTION EXPOSURE APPARATUS

(71) Applicant: Carl Zeiss SMT GmbH, Oberkochen (DE)

(72) Inventors: Markus Deguenther, Aalen (DE); Damian Fiolka, Oberkochen (DE); Gerhard-Wilhelm Ziegler, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 282 days.

(21) Appl. No.: 13/625,072

(22) Filed: Sep. 24, 2012

(65) Prior Publication Data

US 2013/0021591 A1    Jan. 24, 2013

Related U.S. Application Data

(63) Continuation of application No. PCT/EP2010/002780, filed on May 6, 2010.

(51) Int. Cl.
*G03B 27/54* (2006.01)
*G03B 27/42* (2006.01)
(Continued)

(52) U.S. Cl.
CPC ........ *G03F 7/70941* (2013.01); *G02B 17/0892* (2013.01); *G03F 7/70116* (2013.01)

(58) Field of Classification Search
CPC .......................... G03F 7/70116; G03F 7/70941
USPC .................................... 355/52, 53, 55, 67–71
See application file for complete search history.

(56) References Cited

U.S. PATENT DOCUMENTS

| 7,061,582 | B2 | 6/2006 | Zinn et al. |
| 8,379,182 | B2 * | 2/2013 | Dunn .......................... 349/161 |
| 2003/0210468 | A1 | 11/2003 | Kato |

(Continued)

FOREIGN PATENT DOCUMENTS

| EP | 1 262 836 | 12/2002 |
| JP | 2003-322711 | 11/2003 |

(Continued)

OTHER PUBLICATIONS

Japanese Office Action, with translation thereof, for JP Appl No. 2013-508375, dated Feb. 13, 2014.

(Continued)

*Primary Examiner* — Hung Henry Nguyen
(74) *Attorney, Agent, or Firm* — Fish & Richardson P.C.

(57) ABSTRACT

An illumination system of a microlithographic projection exposure apparatus includes a spatial light modulator which varies an intensity distribution in a pupil surface. The modulator includes an array of mirrors that reflect impinging projection light into directions that depend on control signals applied to the mirrors. A prism, which directs the projection light towards the spatial light modulator, has a double pass surface on which the projection light impinges twice, namely a first time when leaving the prism and before it is reflected by the mirrors, and a second time when entering the prism and after it has been reflected by the mirrors. A pupil perturbation suppressing mechanism is provided that reduces reflections of projection light when it impinges the first time on the double pass surface, and/or prevents that light portions being a result of such reflections contribute to the intensity distribution in the pupil surface.

22 Claims, 9 Drawing Sheets

(51) Int. Cl.
*G03F 7/20* (2006.01)
*G02B 17/08* (2006.01)

(56) References Cited

U.S. PATENT DOCUMENTS

| | | |
|---|---|---|
| 2005/0275959 A1 | 12/2005 | Kawaai et al. |
| 2006/0087634 A1 | 4/2006 | Brown et al. |
| 2009/0116093 A1* | 5/2009 | Tanitsu .................... 359/239 |
| 2010/0039629 A1* | 2/2010 | Xalter et al. .............. 355/67 |
| 2011/0027724 A1 | 2/2011 | Tanaka |
| 2012/0293784 A1 | 11/2012 | Xalter et al. |

FOREIGN PATENT DOCUMENTS

| | | |
|---|---|---|
| JP | 2003-322822 | 11/2003 |
| JP | 2004-191878 | 7/2004 |
| JP | 2005-352080 | 12/2005 |
| JP | 2010-096840 | 4/2010 |
| WO | WO 02/19027 | 3/2002 |
| WO | WO 2005/026843 | 3/2005 |
| WO | WO 2008/095695 | 8/2008 |
| WO | WO 2009/060773 | 5/2009 |
| WO | WO 2009/087805 | 7/2009 |
| WO | WO 2009/125511 | 10/2009 |

OTHER PUBLICATIONS

International Search Report for corresponding PCT Appl No. PCT/EP2010/002780, dated Dec. 8, 2010.

* cited by examiner

ILLUMINATION SYSTEM OF A MICROLITHOGRAPHIC PROJECTION EXPOSURE APPARATUS

CROSS-REFERENCE TO RELATED APPLICATIONS

This application is a continuation of, and claims benefit under 35 USC 120 to, international application PCT/EP2010/002780, filed May 6, 2010. International application PCT/EP2010/002780 is hereby incorporated by reference in its entirety.

FIELD

The disclosure generally relates to an illumination system of a microlithographic projection exposure apparatus, and in particular to an illumination system which includes an array of reflective elements used as a spatial light modulator.

BACKGROUND

Microlithography (also referred to as photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultra-violet (DUV) or extreme ultraviolet (EUV) light. Next, the wafer with the photoresist on top is exposed to projection light in a projection exposure apparatus. The apparatus projects a mask containing a pattern onto the photoresist so that the latter is only exposed at certain locations which are determined by the mask pattern. After the exposure the photoresist is developed to produce an image corresponding to the mask pattern. Then an etch process transfers the pattern into the thin film stacks on the wafer. Finally, the photoresist is removed. Repetition of this process with different masks results in a multi-layered microstructured component.

A projection exposure apparatus typically includes an illumination system for illuminating the mask, a mask stage for aligning the mask, a projection objective and a wafer alignment stage for aligning the wafer coated with the photoresist. The illumination system illuminates a field on the mask that may have the shape of a rectangular or curved slit, for example.

Ideally, the illumination system illuminates each point of the illuminated field on the mask with projection light having a well defined intensity and angular distribution. The term angular distribution describes how the total light energy of a light bundle, which converges towards a particular point on the mask, is distributed among the various directions of the rays that constitute the light bundle.

The angular distribution of the projection light impinging on the mask is usually adapted to the kind of pattern to be projected onto the photoresist. For example, relatively large sized features may involve a different angular distribution than small sized features. The most commonly used angular distributions of projection light are referred to as conventional, annular, dipole and quadrupole illumination settings. These terms refer to the intensity distribution in a system pupil surface of the illumination system. With an annular illumination setting, for example, only an annular region is illuminated in the system pupil surface. Thus there is only a small range of angles present in the angular distribution of the projection light, and thus all light rays impinge obliquely with similar angles onto the mask.

Different ways are known to modify the angular distribution of the projection light in the mask plane so as to achieve the desired illumination setting. For achieving maximum flexibility in producing different angular distribution in the mask plane, it has been proposed to use mirror arrays or other spatial light modulators that illuminate the pupil surface.

In EP 1 262 836 A1 the mirror array is a micro-electromechanical system (MEMS) including more than 1000 microscopic mirrors. Each of the mirrors can be tilted about two orthogonal tilt axes. Thus radiation incident on such a mirror device can be reflected into almost any desired direction of a hemisphere. A condenser lens arranged between the mirror array and the pupil surface translates the reflection angles produced by the mirrors into locations in the pupil surface. This known illumination system makes it possible to illuminate the pupil surface with a plurality of spots, wherein each spot is associated with one particular mirror and is freely movable across the pupil surface by tilting this mirror.

Similar illumination systems are known from US 2006/0087634 A1, U.S. Pat. No. 7,061,582 B2 and WO 2005/026843 A2.

However, using a mirror array in the illumination system can also involve re-designing the illumination system to some extent. For example, the use of a mirror array typically involves an additional beam folding mechanism such as prisms or plane folding mirrors to keep the overall dimensions of the illumination system small.

In this context US 2009/0116093 A1 proposes a special prism that includes a first surface and a second surface at which impinging projection light is reflected by total internal reflection. The first surface reflects the projection light towards a surface from which the projection light leaves the prism and falls on the mirror array. The projection light reflected from the mirror array enters the prism again via this surface and impinges on the second surface. From there it is directed towards a condenser lens arranged between the prism and a pupil surface of the illumination system. Therefore the prism is similar to a conventional K prism with the exception that light is coupled out of the prism and coupled into the prism the surface through which the projection light passes twice. In a conventional K prism, the prism angle formed between the first and the second reflecting surfaces is different so that also this surface reflects all the light by total internal reflection.

Using a prism instead of mirrors for beam folding purposes can be advantageous because at present the reflective coatings of mirrors have, for the wavelengths typically used in microlithographic illumination systems, a reflectivity which is not substantially above 95%, whereas the process of total internal reflection results in a reflectivity of nearly 100%.

However, in the pupil surface of the illumination system disclosed in the afore-mentioned US 2009/0116093 A1 the light intensity distribution is often not satisfactory. In particular, there are undesired light contributions to the intensity distribution in the pupil surface. These light contributions can perturb the angular light distribution of projection light illuminating the mask.

SUMMARY

The disclosure provides an illumination system including a reflective spatial light modulator and a beam folding unit such that undesired light contributions to the intensity distribution in the pupil surface can be prevented or at least significantly reduced.

In one aspect, the disclosure provides an illumination system of a microlithographic projection exposure apparatus including a light source, which is configured to produce projection light, and a pupil surface. The illumination system further includes a spatial light modulator which is configured to vary an intensity distribution in the pupil surface. The spatial light modulator includes an array of reflective elements which are configured to reflect impinging projection light into directions that depend on control signals applied to the reflective elements. A beam folding unit including at least one prism directs the projection light produced by the light source towards the spatial light modulator. The at least one prism has a double pass surface on which the projection light impinges twice, namely a first time when leaving the at least one prism and before it is reflected by the reflective elements, and a second time when entering the at least one prism and after it has been reflected by the reflective elements. The illumination system further includes a pupil perturbation suppressing mechanism which is configured to reduce reflections of projection light when it impinges the first time on the double pass surface, and/or to prevent that light portions being a result of such reflections contribute to the intensity distribution in the pupil surface.

The disclosure is based on the realization that the light portions perturbing the desired intensity distribution in the pupil surface are caused by reflections of projection light at the double pass surface. If light leaves the prism by passing through the double pass surface under a non-zero angle of incidence, a small fraction of the light is reflected. Usually such reflections are of little concern in illumination systems because the reflected light will be absorbed by some components of the illumination system so that it reduces the amount of light which is available for the illumination of the mask, but does not perturb the illumination of the mask as such.

However, in the case of the double pass surface used in the at least one prism of the beam folding unit, light reflected at the double pass surface would usually not impinge on some absorbent component of the illumination system, but would be directed towards the pupil surface. More particularly, the reflected light would emerge from the prism as collimated light which is focused by a subsequent condenser right into the center of the pupil surface.

Such an undesired light contribution to the intensity distribution in the center of the pupil surface (i.e. on the optical axis) can have particularly adverse effects in the case of certain non-conventional illumination settings, for example annular, dipole or quadrupole illumination settings. With these illumination settings the center of the pupil surface shall not be illuminated at all. But also for conventional illumination settings which involve an illumination of the center of the pupil surface, the contributions from the light reflected at the double pass surface may compromise the quality of the pupil illumination as a result of interference effects.

To suppress such perturbations of the pupil illumination, the disclosure proposes to either reduce the reflection of projection light at the double pass surface, and/or to prevent that light portions being a result of such reflections contribute to the intensity distribution in the pupil surface.

In one embodiment the pupil perturbation suppressing mechanism includes an anti-reflective coating which is applied on the double pass surface. Although such anti-reflective coatings usually absorb a certain amount of light, the positive effect of reducing the reflections predominates the small light losses which are associated with the use of anti-reflective coatings.

In another embodiment the pupil perturbation suppressing mechanism includes diffractive structures that are applied to the double pass surface. By suitably determining the dimensions of the diffractive structures, it can be achieved that light reflected at the double pass surface will undergo destructive interference so that reflections are reduced.

According to another embodiment the pupil perturbation suppressing mechanism includes a mechanism ensuring that the angle of incidence of the projection light, when it impinges the first time on the double pass surface, equals the Brewster angle. This approach exploits the fact that light in a p-polarization state is not reflected at an optical surface if it impinges under the Brewster angle. Even if the light impinging on the double pass surface has no preferred state of polarization, this measure will reduce the amount of reflected light by 50%. This reduction increases the higher the degree of polarization is for light in a p-polarization state when it impinges the first time on the double pass surface. Therefore it is preferred that at least 80%, and more preferably at least 95%, of the projection light is in a p-polarization state when it impinges the first time on the double pass surface. Ideally 100% of the projection light is in a p-polarization state, because then no light at all will be reflected at the double pass surface.

A polarizing unit may be provided in the polarization system that transforms an initial state of polarization, which the projection light has when it impinges on the polarizing unit, into a p-polarization state. Such a polarizing unit may include a half-wave plate, a quarter-wave plate and at least two birefringent plates having a non-uniform thickness. With such a polarizing unit any arbitrary spatial distribution of defined polarization states may be transformed into a p-polarization state.

According to still another embodiment the pupil perturbation suppressing mechanism includes a liquid which fills an interspace formed between the double pass surface and the reflective elements of the spatial light modulator. Such a liquid significantly reduces the reflections at the double pass surface, because it brings the refractive index ratio at the double pass surface close to 1. If the refractive index of the liquid equals the refractive index of the at least one prism, no reflections at all occur at the double pass surface.

According to a further embodiment at least one prism includes a first reflective surface and a second reflective surface. The pupil perturbation suppression mechanism includes a mechanism ensuring that the double pass surface forms different angles with the first and second reflective surfaces so that the light portions being a result of reflections at the double pass surface do not reach the pupil surface. The oblique orientation of the double pass surface breaks up the symmetry of the at least one prism which is the basic reason why light reflected at the double pass surface of the at least one prism is directed towards the center of the pupil surface.

According to a still further embodiment the pupil perturbation suppressing mechanism includes a mechanism ensuring that the double pass surface is arranged at such a distance from the spatial light modulator that areas on the double pass surface, on which projection light impinges the first time, are completely separated from areas on the double pass surface, on which the projection light impinges the second time. Since the undesired reflections only occur on the area of the double pass surface on which the projection light impinges the first time, the spatial separation of this area from the area on which the projection light impinges the second time makes it possible to prevent reflected light from reaching portions of the prism through which also projection light reflected by the spatial light modulator propagates.

According to yet another embodiment the pupil perturbation suppressing mechanism includes an obscurator which is configured to be inserted into a light path of the projection light between the prism and the pupil surface at a position such that it obstructs the light portions being a result of reflections at the double pass surface so that they do not reach the pupil surface. This measure, which is only useful for illumination settings for which the center of the pupil surface shall be dark, removes the undesired light portions at the latest possible stage, i.e. immediately before they reach the pupil surface.

The obscurator may include a light intensity sensor that is configured to detect the intensity of projection light impinging on it. Then the projection light, or at least a part of it, that would otherwise be lost by absorption on the obscurator is used to provide information on the intensity of the projection light. In this context it should be noted that illumination system usually contain a light intensity sensor for monitoring the intensity of projection light produced by the light source. Such a light intensity sensor has to branch off a small but not negligible amount of projection light. However, if such a light intensity sensor is used as an obscurator in the context of the disclosure, there is no (or at least a reduced) additional light loss incurred by the obscurator. Using a monitor light intensity sensor as obscurator involves the light intensity at the position of the sensor is proportional to the intensity produced by the light source, or at least that the dependency between the two intensities being known. This condition is usually fulfilled.

According to another aspect, the disclosure provides an illumination system of a micro-lithographic projection exposure apparatus including a light source, which is configured to produce projection light, and a pupil surface. The illumination system further includes a spatial light modulator which is configured to vary an intensity distribution in the pupil surface. The spatial light modulator includes an array of reflective elements which are configured to reflect impinging projection light into directions that depend on control signals applied to the reflective elements. A beam folding unit is provided that includes at least one prism. The beam folding unit directs the projection light produced by the light source towards the spatial light modulator. The at least one prism has a double pass surface on which the projection light impinges twice, namely a first time when leaving the prism and before it is reflected by the reflective elements, and a second time when entering the prism and after it has been reflected by the reflective elements. In accordance with this second aspect the illumination system further includes a light intensity detector which detects the total intensity of the projection light at a position between the light source and a mask to be illuminated. The illumination system further includes a control unit which controls the spatial light modulator depending on the total intensity measured by the light intensity detector.

According to this second aspect of the disclosure no measures may be taken that prevent the light portions being a result of reflections at the double pass surface from reaching the pupil surface. Instead, these contributions to the intensity distribution in the pupil surface are accepted, but taken into account computationally. More particularly, the reflective elements of the spatial light modulator are controlled in such a way that the real intensity distribution obtained in the pupil surface equals the desired intensity distribution. Usually this will mean that some of the reflective elements do not direct light towards the center of the pupil surface (as it would be in the absence of such undesired reflections) because these reflections already contribute to the illumination of this area. In this context it is assumed that the intensity of the light portions being a result of undesired reflections at the double pass surface are proportional to the total intensity of the light measured by the light intensity detector. It is to be noted, however, that this approach functions well only for conventional illumination settings or for non-conventional illumination settings for which also the center of the pupil surface shall be illuminated.

Instead of assuming a proportionality between the total light intensity and the intensity of the contributions originating from the undesired reflections at the double pass surface, the intensity of these contributions may also directly be measured at the pupil surface by arranging the light intensity detector in the system pupil surface. The light intensity detector may be inserted into the beam path during disruptions of the projection operation, or a small fraction of the light may be coupled out of the beam path using a semi-transparent mirror, for example.

BRIEF DESCRIPTION OF THE DRAWINGS

Various features and advantages of the disclosure may be more readily understood with reference to the following detailed description taken in conjunction with the accompanying drawing, in which.

DESCRIPTION OF PREFERRED EMBODIMENTS

I. General Construction of Projection Exposure Apparatus

Figure 1:
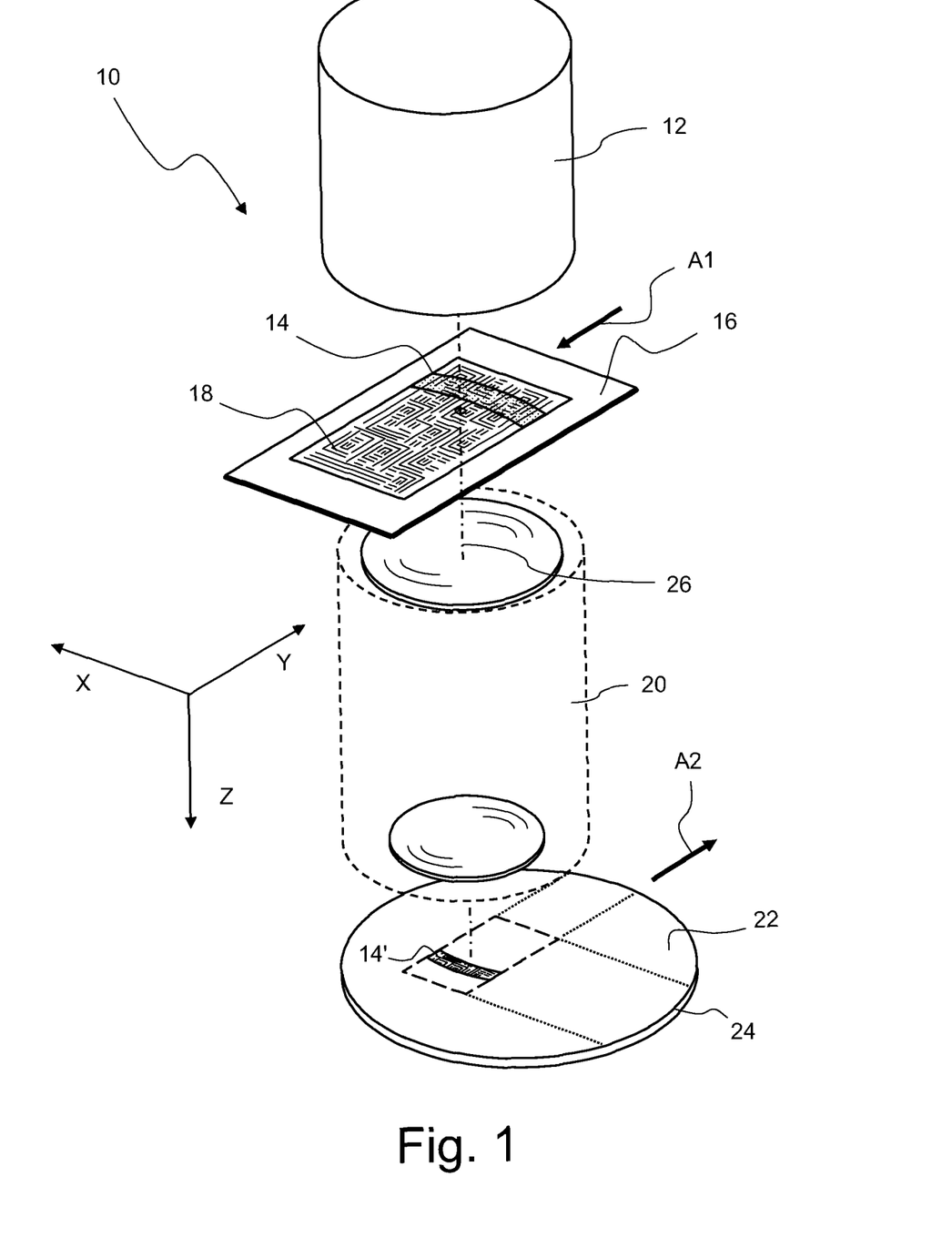
FIG. 1 is a perspective and considerably simplified view of a projection exposure apparatus in accordance with the disclosure.

FIG. 1 is a perspective and highly simplified view of a projection exposure apparatus 10 including an illumination system 12 which produces a projection light beam. The projection light beam illuminates a field 14 on a mask 16 containing minute structures 18. In this embodiment the illuminated field 14 has the shape of a ring segment. However, other shapes of the illuminated field 14, for example rectangles, are contemplated as well.

A projection objective 20 images the structures 18 within the illuminated field 14 onto a light sensitive layer 22, for example a photoresist, which is supported by a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. Since the latter has a magnification β with |β|<1, a minified image 14' of the structures 18 within the illuminated field 14 is projected onto the light sensitive layer 22.

During the projection the mask 16 and the substrate 24 move along a scan direction which coincides with the Y direction indicated in FIG. 1. The illuminated field 14 then scans over the mask 16 so that structured areas larger than the illuminated field 14 can be continuously projected. Such a type of projection exposure apparatus is often referred to as "step-and-scan tool" or simply a "scanner". The ratio between the velocities of the substrate 24 and the mask 16 is equal to the magnification β of the projection objective 20. If the projection objective 20 inverts the image (β<0), the mask 16 and the substrate 24 move in opposite directions, as this is indicated in FIG. 1 by arrows A1 and A2. However, the disclosure may also be used in stepper tools in which the mask 16 and the substrate 24 do not move during projection of the mask.

II. General Construction of Illumination System

Figure 2:
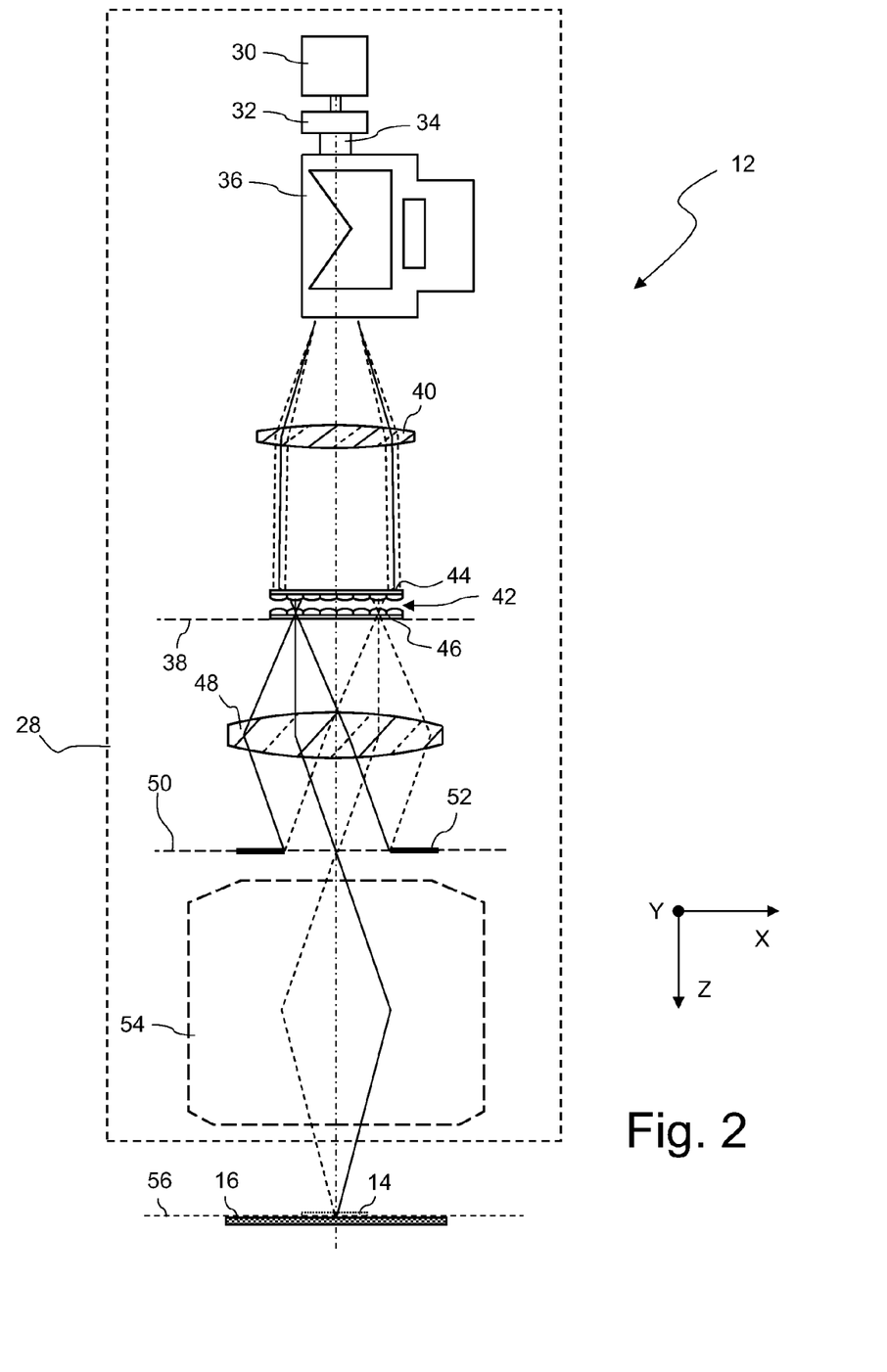
FIG. 2 is a meridional section through an illumination system which is part of the apparatus shown in FIG. 1.

FIG. 2 is a meridional section through the illumination system 12 shown in FIG. 1. For the sake of clarity, the illustration of FIG. 2 is considerably simplified and not to scale. This particularly implies that different optical units are represented by one or very few optical elements only. In reality, these units may include significantly more lenses and other optical elements.

The illumination system 12 includes a housing 28 and a light source 30 that is, in the embodiment shown, an excimer laser. The light source 30 emits projection light having a wavelength of about 193 nm. Other types of light sources 30 and other wavelengths, for example 248 nm or 157 nm, are also contemplated.

In the embodiment shown, the projection light emitted by the light source 30 enters a beam expansion unit 32 in which the light beam is expanded. The beam expansion unit 32 may include several lenses or may be a mirror arrangement, for example. The projection light emerges from the beam expansion unit 32 as an almost collimated beam 34.

The projection light beam 34 then enters a spatial light modulating unit 36 that is used to produce a variable intensity distribution at a pupil surface 38. Various embodiments of the spatial light modulating unit 36 will be described in more detail below with reference to FIGS. 3 to 9.

Between the spatial light modulating unit 36 and the pupil surface 38 a condenser 40 is arranged which transforms the different directions of the light rays emerging from the spatial light modulating unit 36 into different locations at the pupil surface 38. In other embodiments the condenser 40 is dispensed with so that the spatial light modulating unit 36 directly illuminates the pupil surface 38 in the far field.

In or in close vicinity to the pupil surface 38 an optical integrator 42 is arranged which includes two optical raster elements 44, 46 which may include arrays of cylindrical lenses or fly's eye lenses, for example. The optical integrator 42 produces a plurality of secondary light sources that each illuminate, via a further condenser 48, an intermediate field plane 50 in which a field stop 52 is arranged. The further condenser 48 assists in superimposing the light bundles, which have been emitted by the secondary light sources, in the intermediate field plane 50. Due to this superposition a very uniform illumination of the intermediate field plane 50 is achieved. The field stop 52 may include a plurality of moveable blades and ensures, to the extent desired, sharp edges of the illuminated field 14 on the mask 16.

A field stop objective 54 provides optical conjugation between the intermediate field plane 50 and a mask plane 56 in which mask 16 is arranged. The field stop 52 is thus sharply imaged by the field stop objective 54 onto the mask 16.

III. Spatial Light Modulating Unit

In the following various embodiments of the spatial light modulating unit 36 will be described. As will become apparent, the spatial light modulating units 36 differ from one another mainly with respect to a pupil perturbation suppressing mechanism incorporated therein.

1. First Embodiment—Anti-reflective Coating

Figure 3:
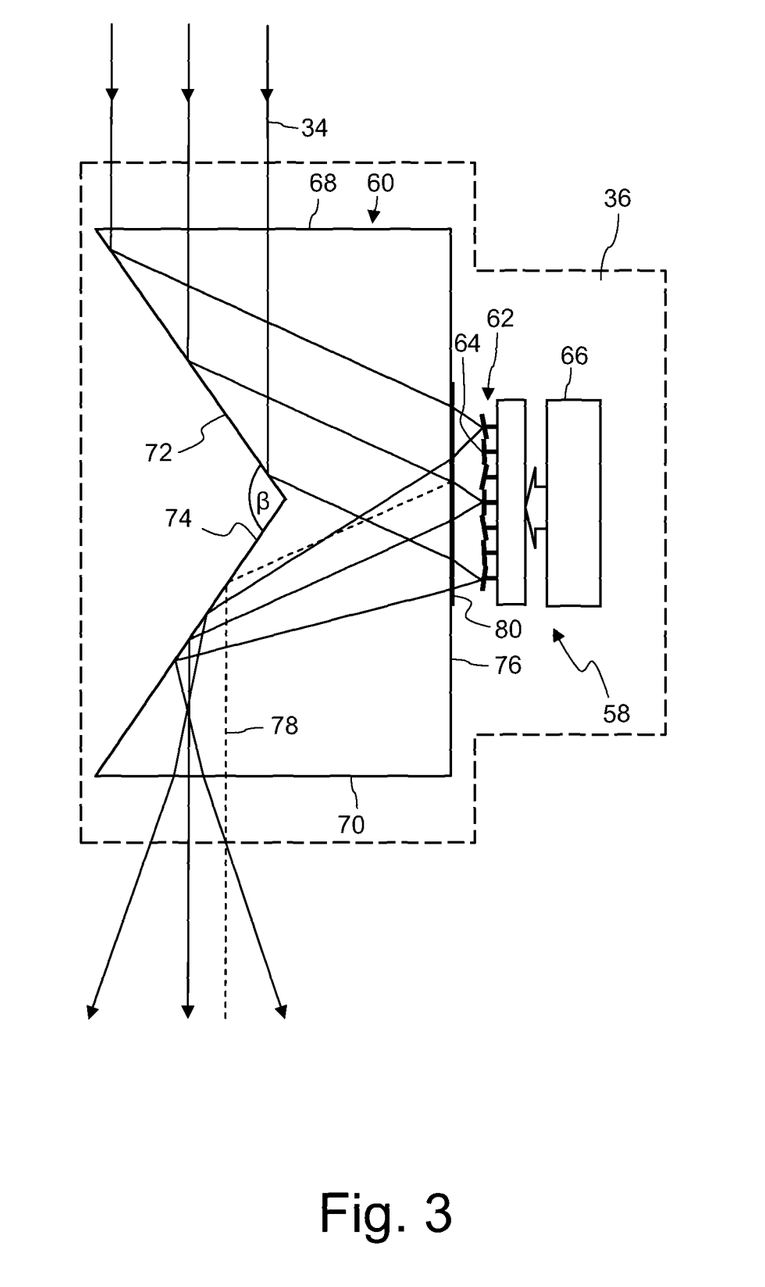
FIG. 3 is an enlarged meridional section through the spatial light modulating unit shown in FIG. 2 including an anti-reflective coating applied on the double pass surface.

FIG. 3 is an enlarged meridional section through the spatial light modulating unit 36 shown in FIG. 2. The spatial light modulating unit 36 includes a spatial light modulator 58 and a prism 60.

The spatial light modulator 58 includes a mirror array 62 which, in turn, includes a plurality of small individual mirrors 64 that can be tilted, independently from each other, by two tilt axes that are preferably aligned perpendicularly to each other. The mirror array 64 may be a microelectromechanical system (MEMS), and in particular as a digital micro-mirror device (DMD).

The spatial light modulator 58 further includes a mirror control unit 66 which controls the tilting movements of the mirrors 64 and is connected to an overall system control (not shown) of the illumination system 12. Actuators that are used to set the desired tilt angles of the mirrors 64 receive control signals from the mirror control unit 66 such that each individual mirror 64 is capable of reflecting an impinging light ray by a reflection angle that is variable in response to the control signal. In the embodiment shown there is a continuous range of tilt angles at which the individual mirrors 64 can be oriented. In other embodiments the actuators are configured such that only a limited number of discrete tilt angles can be set.

Instead of a mirror array 62 an array of other reflective elements may be used that are configured to reflect impinging projection light into directions that depend on control signals applied to the reflective elements. Such elements may include, for example, electro-optical or acousto-optical cells. In such cells the refractive index may be varied by exposing a suitable material to electric fields or ultrasonic waves, respectively. These effects can be exploited to produce index gratings that direct impinging light into various directions.

The prism 60 has generally the shape of a K prism, although it has a different function. More specifically, the prism 60 has a pair of opposite flat surfaces, namely a light entry surface 68 and a light exit surface 70. The prism 60 further includes two flat reflective surfaces, namely a first reflective surface 72 and a second reflective surface 74. The two reflective surfaces 72, 74 are arranged at a prism angle β with respect to each other. Opposite the two reflective surfaces 72, 74 a flat surface 76 extends in a plane which is arranged perpendicular to the light entry surface 68 and the light exit surface 70. For reasons which become apparent below this surface will be referred to in the following as double pass surface 76.

In the embodiment shown the prism 60 consists of a material which has a high transmittance for the projection light. For projection light having a wavelength of 193 nm, calcium fluoride ($CaF_2$) may be used as optical material because it has a higher transmittance than fused silica or other glasses. Reducing transmission losses is not only important with regard to the throughput of the projection exposure apparatus 10, but also avoids problems caused by heat which is created inside the prism 60 by the absorption of projection light.

The prism 60 may be produced from a single piece of material, but may also be assembled from individual smaller prisms. For example, the upper and the lower half of the prism 60 shown in FIG. 3 may be formed by two individual prisms that each includes one of the reflective surfaces 72 or 74. Furthermore, the prism 60 may have additional edges and surfaces. For example, those portions through which no projection light passes may be completely dispensed with to reduce the costs of the optical material.

In the following the function of the spatial light modulating unit 36 will be explained:

The projection light beam 34, which is at least substantially collimated, enters the prism 60 substantially perpendicularly through its light entry surface 68 and is then completely reflected at its first reflective surface 72 by total internal reflection. Total internal reflection occurs because the prism angle β formed between the two reflective surfaces 72, 74 is selected such that the angle of incidence of the projection light on the first reflective surface is equal to or greater than the critical angle $\alpha_c$. For calcium fluoride (n~1.50 for λ=193 nm) the critical angle $\alpha_c$ is about 42°.

After being reflected at the first reflective surface 72 the projection light beam 34 impinges on the double pass surface 76. At this surface the angle of incidence is smaller than the critical angle $\alpha_c$ so that the greatest portion of the projection light 34 leaves the prism 60 and impinges on the tiltable mirrors 64 of the mirror array 62. The mirrors 64 reflect the impinging projection light into directions that depend on the control signals supplied by the mirror control unit 66 to the mirrors 64. Generally the tilt angles of the mirrors 64 will not exceed a few degrees so that the largest portion of projection light reflected by the mirrors 64 is able to enter the prism 60 through the double pass surface 76. Since this is the second time that the projection light passes through the surface 76, the latter is referred to here as double pass surface.

The projection light which now propagates within the prism 60 towards the second reflective surface 74 will now have propagation directions which depend on the tilt angles of the mirrors 64 from which the light has been reflected. However, the directions are still within a range such that the angles of incidence on the second reflective surface 74 are equal to or greater than the critical angle $\alpha_c$. Thus projection light which has entered the prism 60 through the double pass surface 76 is completely reflected at the second reflective surface 74 and directed towards the light exit surface 70. From this surface 70 the projection light 34 leaves the prism 60 and the spatial light modulating unit 36 in various directions. As mentioned above, the condenser 40 will then translate the various directions into different locations in the pupil surface 38 of the illumination system 12.

In the foregoing description of the function of the spatial light modulating unit 36 it has been mentioned that the greatest part of the projection light passes through the double pass surface 76 when it impinges the first time on it. This implies, however, that a small portion of the projection light would be reflected at the double pass surface 76. In FIG. 3 a light ray indicated with a broken line 78 represents such a reflected light portion. Due to the symmetry of the prism 60, the light reflected at the double pass surface 76 would impinge on the second reflective surface 74 with the angle of incidence under which the projection light impinges on the first reflective surface 72. Consequently, the reflected light portion 78 would emerge from the prism 60 parallel to the direction of the incoming projection light beam 34. As it is shown in FIG. 2, the condenser 40 would then focus the parallel reflected light portion into the center of the pupil surface 38. There the light portions being a result of reflections at the double pass surface 76 would produce a light spot and thus perturb the intensity distribution in the pupil surface 38.

The light portions being a result of reflections at the double pass surface 76 and contributing to the intensity distribution in the pupil surface 38 have an adverse effect on the angular light distribution of projection light illuminating the mask 16. This is particularly true for illumination systems in which no light shall impinge perpendicularly on the mask 16, which implies that the center of the pupil surface 38 has to be completely dark. But also for illumination settings in which the center of the pupil surface 38 shall be illuminated, such contributions from reflected light may have an adverse effect due to interferences. In the following these adverse effects are referred to as pupil perturbations.

In the embodiment of the spatial light modulating unit 36 shown in FIG. 3 the reflections of projection light when it impinges the first time on the double pass surface 76 are reduced by an anti-reflective coating 80 which is applied at least on those portions of the double pass surface 76 on which the projection light 34 impinges the first time. The anti-reflective coating 80 therefore suppresses at least to some extent pupil perturbations that may otherwise be caused by projection light 78 that is reflected when impinges the first time on the double pass surface 76.

2. Second Embodiment—Diffractive Structures

Figure 4:
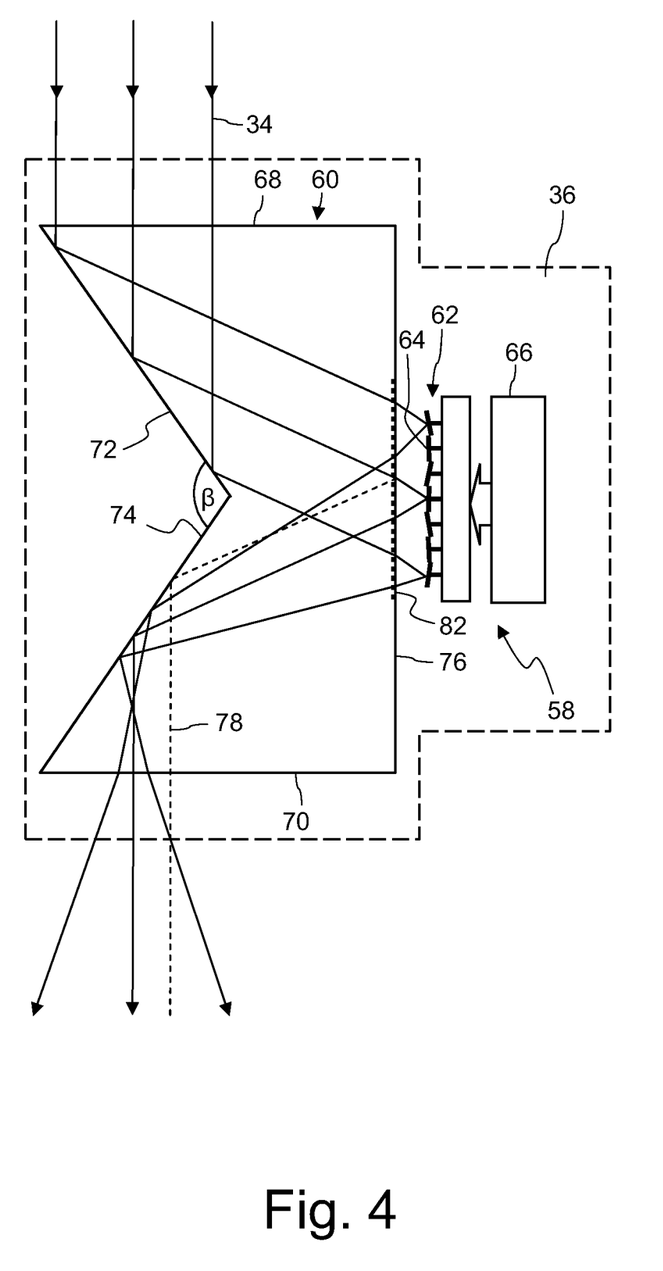
FIG. 4 is an enlarged meridional section through a spatial light modulating unit according to a second embodiment including diffractive structures applied on the double pass surface.

The spatial light modulating unit 36 shown in FIG. 4 differs from the spatial light modulating unit 36 shown in FIG. 3 only in that the anti-reflective coating 80 is replaced by diffractive structures 82 that are applied to the double pass surface 76. The dimensions of the diffractive structures 82 are determined in such a way that light reflected at the diffractive structures 82 interferes destructively. This substantially reduces reflections of projection light 34 when it impinges the first time on the double pass surface 76.

3. Third Embodiment—Brewster Angle

Figure 5:
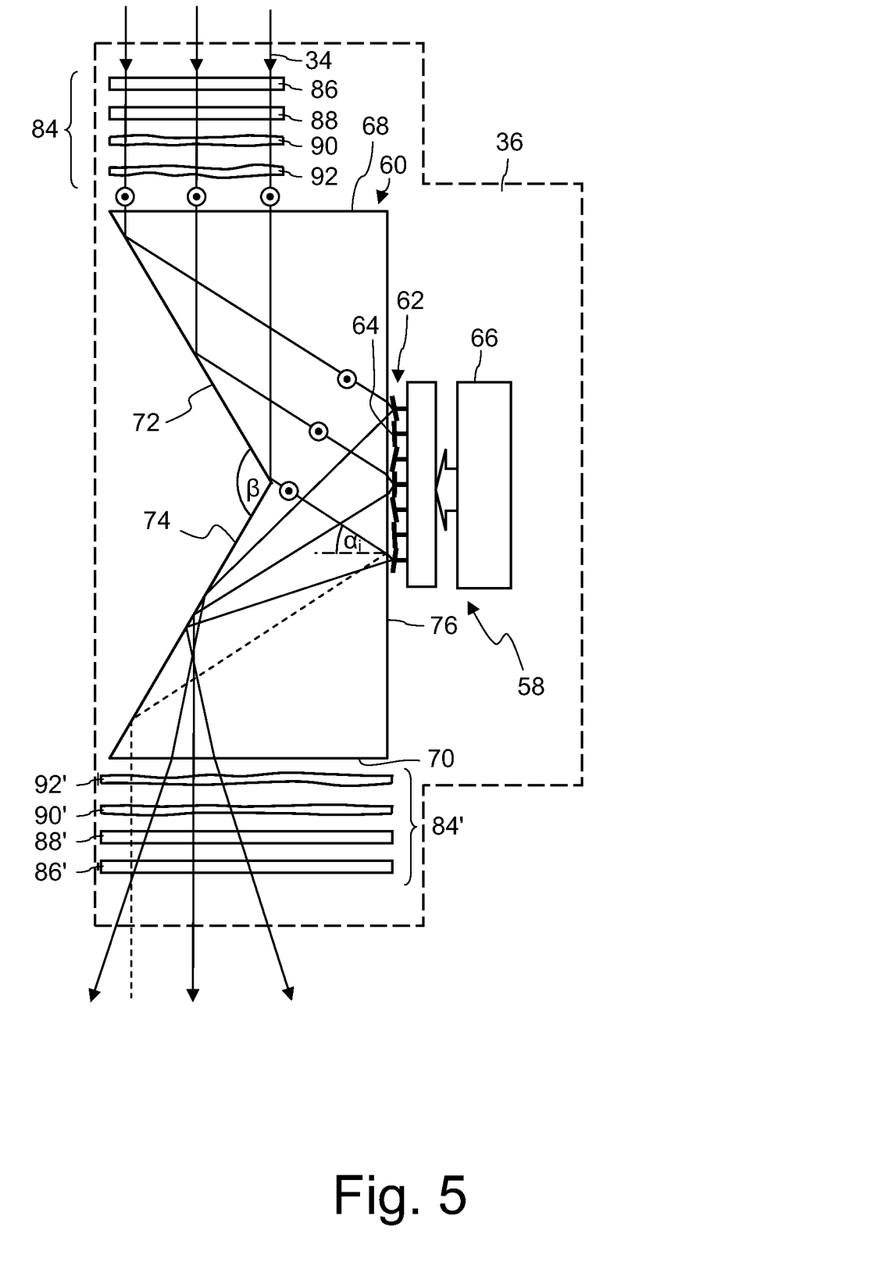
FIG. 5 is an enlarged meridional section through a spatial light modulating unit according to a third embodiment in which the projection light impinges on the double pass surface under the Brewster angle.

In the embodiment of a spatial light modulating unit 36 shown in FIG. 5 the prism angle β is increased to such an extent that the angle of incidence $\alpha_i$ of the projection light 34 equals the Brewster angle $\alpha_p$ when it impinges the first time on the double pass surface 76. If calcium fluoride is used as material for the prism 60 and the wavelength λ of the projection light is 193 nm, the refractive index $n_1$ of the prism is 1.5015. Assuming for the refractive index $n_0$ of the surrounding medium $n_0=1$, the Brewster angle $\alpha_p$ given by arctan($n_0/n_1$) is then about 33.66°. If p-polarized light impinges under the Brewster angle $\alpha_p$ on the double pass surface 76, reflections are completely suppressed. If impinging projection light 34 is unpolarized or circular depolarized, it can be decomposed into one half of s-polarized and one half of p-polarized light, so that even then the reflections are reduced by 50%. Generally, the higher the degree of p-polarization is, the smaller the reflections at the double pass surface 76 will be.

In the embodiment shown the spatial light modulating unit 36 includes a polarizing unit 84 which is arranged between the beam expansion unit 32 and the light entry surface 68 of the prism 60. The polarizing unit 84 transforms an initial state of polarization, which the projection light 34 has when it impinges on the polarizing unit 84, into a p-polarization state. To this end the polarizing unit 84 includes a half-wave plate 86, a quarter-wave plate 88 and two birefringent plates 90, 92 having a non-uniform thickness distribution. With such an arrangement of plates it is possible to transform any arbitrary spatial distribution of linear or elliptical states of polarization into a p-polarization state.

If the optical material, from which the prism 60 is made, is birefringent, this may also be taken into account by the polarizing unit 84. For example, if the prism 60 is made of calcium fluoride which is intrinsically birefringent, the orientation of the crystal lattice has to be known such that for each light ray the retardance caused by the intrinsic birefringence can be computed and taken into account. In this case it may also be envisaged to separate the prism 60 into two or more smaller prisms whose crystal lattices are arranged in such a manner that the retardances produced in each piece compensate each other at least to some extent.

Behind the light exit surface 70 of the prism 60 a further polarizing unit 84' may be arranged that transforms the state of polarization, which the projection light 34 has after it has been reflected by the mirrors 64 and propagated again through the prism 60, into any desired state of polarization. The further polarizing unit 84' may also include a half-wave plate 86', a quarter-wave plate 88' and two birefringent plates 90', 92' having a non-uniform thickness.

4. Fourth Embodiment—Liquid

Figure 6:
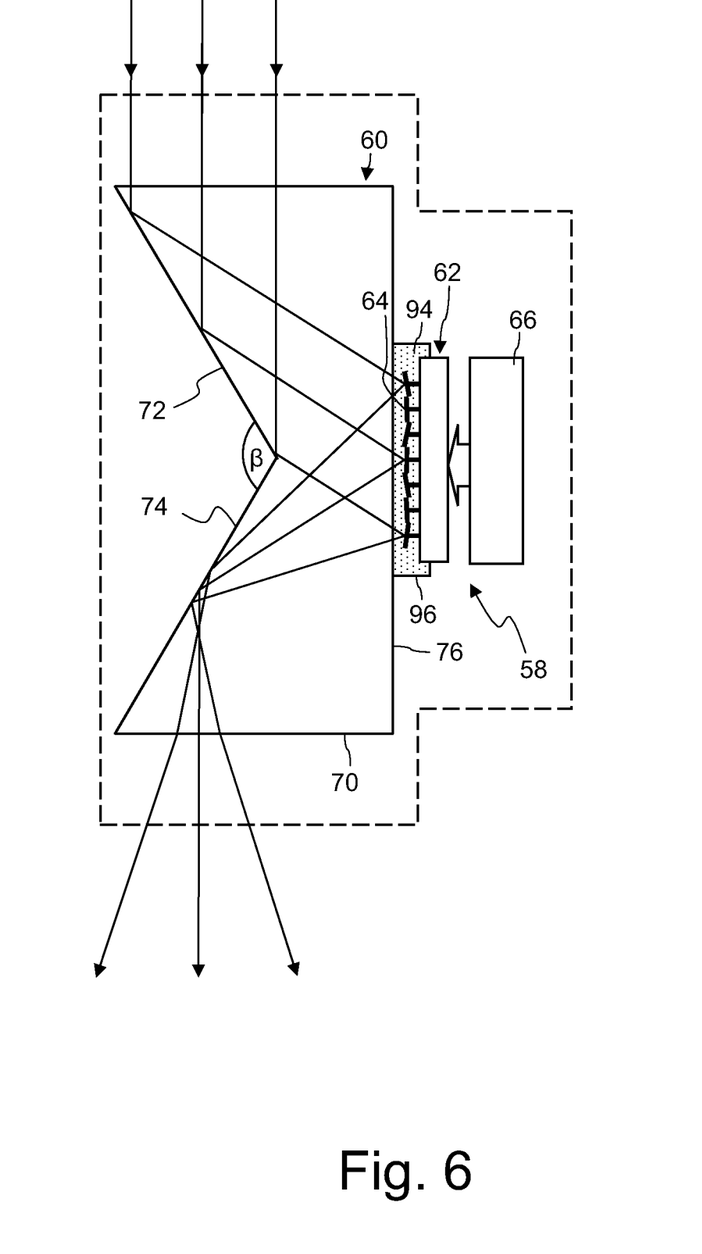
FIG. 6 is an enlarged meridional section through a spatial light modulating unit according to a fourth embodiment including a liquid filling an interspace between the double pass surface and the mirrors of the spatial light modulator.

FIG. 6 shows a spatial light modulating unit 36 which includes a liquid 94 filling an interspace formed between the double pass surface 76 and the mirrors 64. To this end the spatial light modulating unit 36 includes a casing 96 which surrounds this interspace and ensures that the liquid 94 remains in place. The liquid 94 may be circulated within the interior of the casing 96 by a pump (not shown). Furthermore, a temperature controller may be provided that ensures a constant temperature of the liquid 94.

If the liquid 94 is a high index liquid, the refractive index ratio of the liquid 94 and the material of the prism 60 may approach 1 so that no light is reflected at the double pass surface 76. Even if water having a refractive index of about 1.4 is used as the liquid 94 and calcium fluoride having a refractive index of about 1.50 is used as material for the prism 60, the refractive index ratio is very close to 1 so that reflections of projection light impinging the first time on the double pass surface 76 are significantly reduced.

5. Fifth Embodiment—Oblique Double Pass Surface

Figure 7:
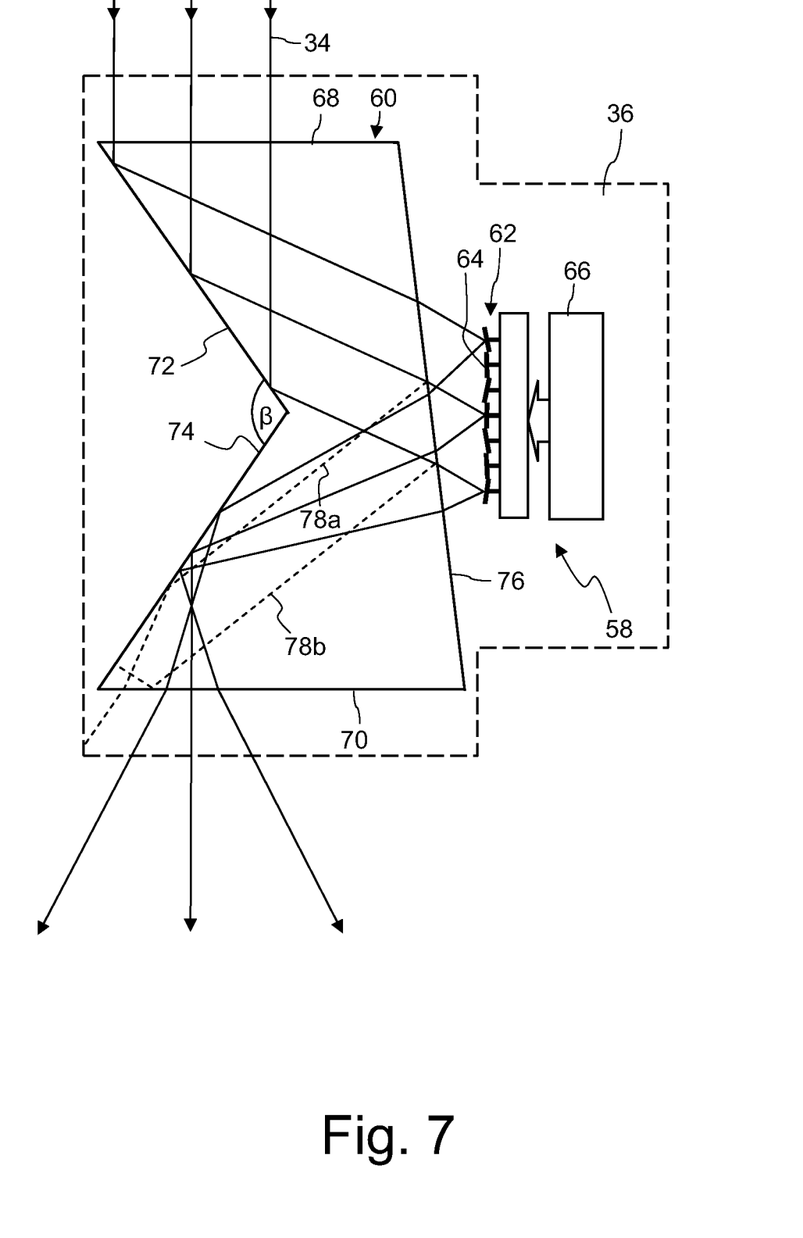
FIG. 7 is an enlarged meridional section through a spatial light modulating unit according to a fifth embodiment in which the double pass surface is obliquely arranged.

FIG. 7 shows a fourth embodiment of a spatial light modulating unit 36 in which no measures are taken to reduce reflections at the double pass surface 76. However, the light portions resulting from such reflections are prevented from reaching the pupil surface 38.

To this end the spatial light modulating unit 36 of this embodiment includes a prism 60 having a double pass surface 76 which forms different angles with respect to the first and the second reflective surfaces 72, 74. More particularly, the angle formed between the double pass surface 76 and the first reflective surface 72 is smaller than the angle formed between the double pass surface 76 and the second reflective surface 74. By suitably selecting these angles it can be achieved that projection light, which is reflected at the double pass surface 76 when it first impinges the first time on it, does not reach the pupil surface 38.

In FIG. 6 broken lines 78a, 78b indicate such light portions being a result of reflection at the double pass surface 76. The reflected ray 78a impinges on the second reflective surface 74 with such a large angle of incidence that it can be blocked out of the light path after it has left the prism 60. The other ray 78b impinges with such a large angle of incidence on the light exit surface 70 that it is reflected by total internal reflection. Thus none of the rays 78a, 78b contributes to the intensity distribution in the pupil surface 38.

6. Sixth Embodiment—Spatial Separation

Figure 8:
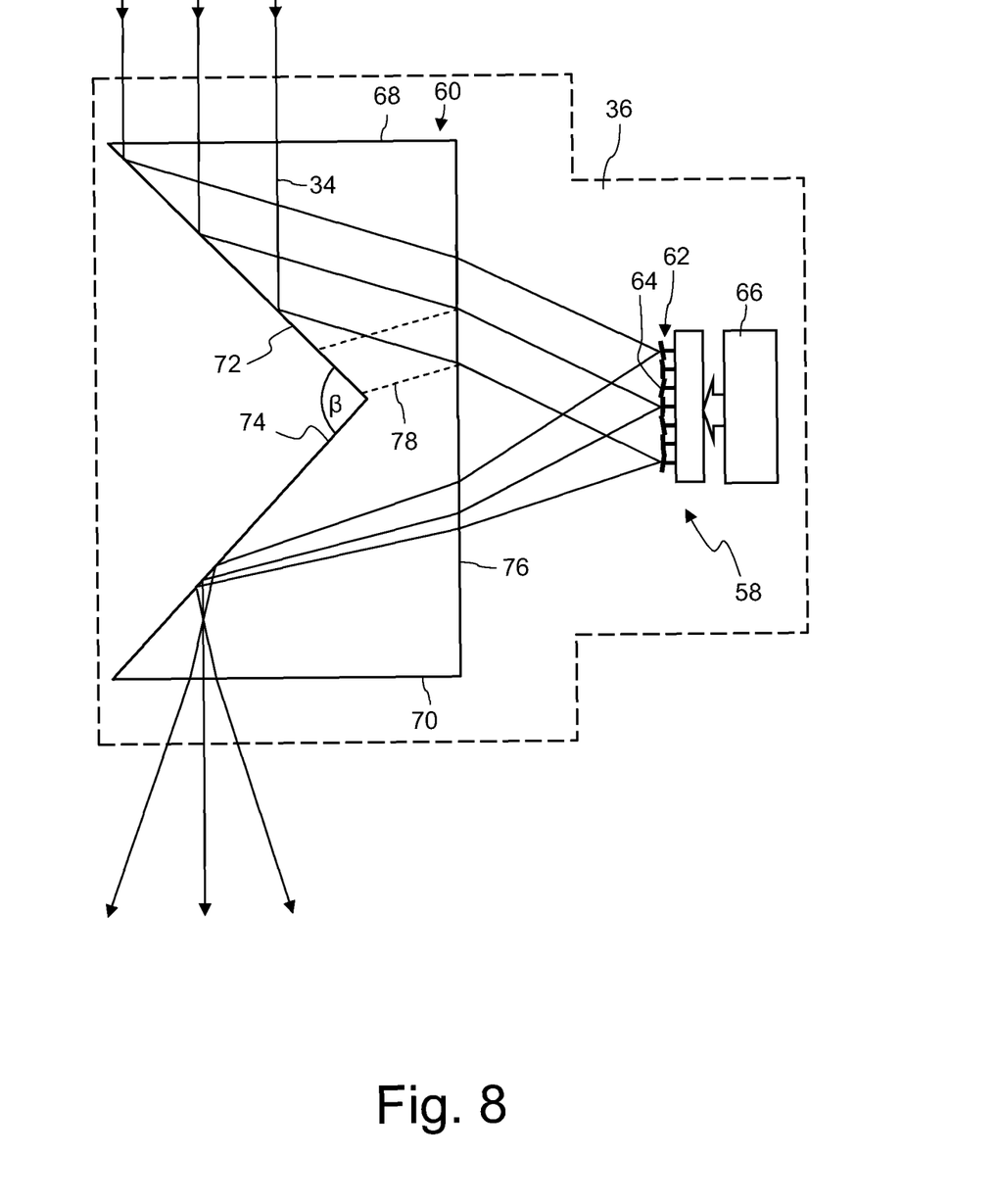
FIG. 8 is an enlarged meridional section through a spatial light modulating unit according to a sixth embodiment in which the distance between the double pass surface and the spatial light modulator is increased.

Also in the embodiment of a spatial light modulating unit 36 shown in FIG. 8 no measures are taken to reduce reflections at the double pass surface 76, but to prevent light portions resulting from such reflections from reaching the pupil surface 38.

In this embodiment the mirror array 62 of the spatial light modulator 58 is arranged at a larger distance away from the double pass surface 76. This larger distance has the effect that areas on the double pass surface 76, on which the projection light 34 impinges the first time, are completely separated from areas on the double pass surface 76, on which the projection light impinges the second time. Then light portions 78 reflected at the double pass surface 76 cannot impinge on the second reflective surface 74, but are reflected at the first reflective surface 72 and do not reach the pupil surface 38.

7. Seventh Embodiment—Pupil Obscurator

Figure 9:
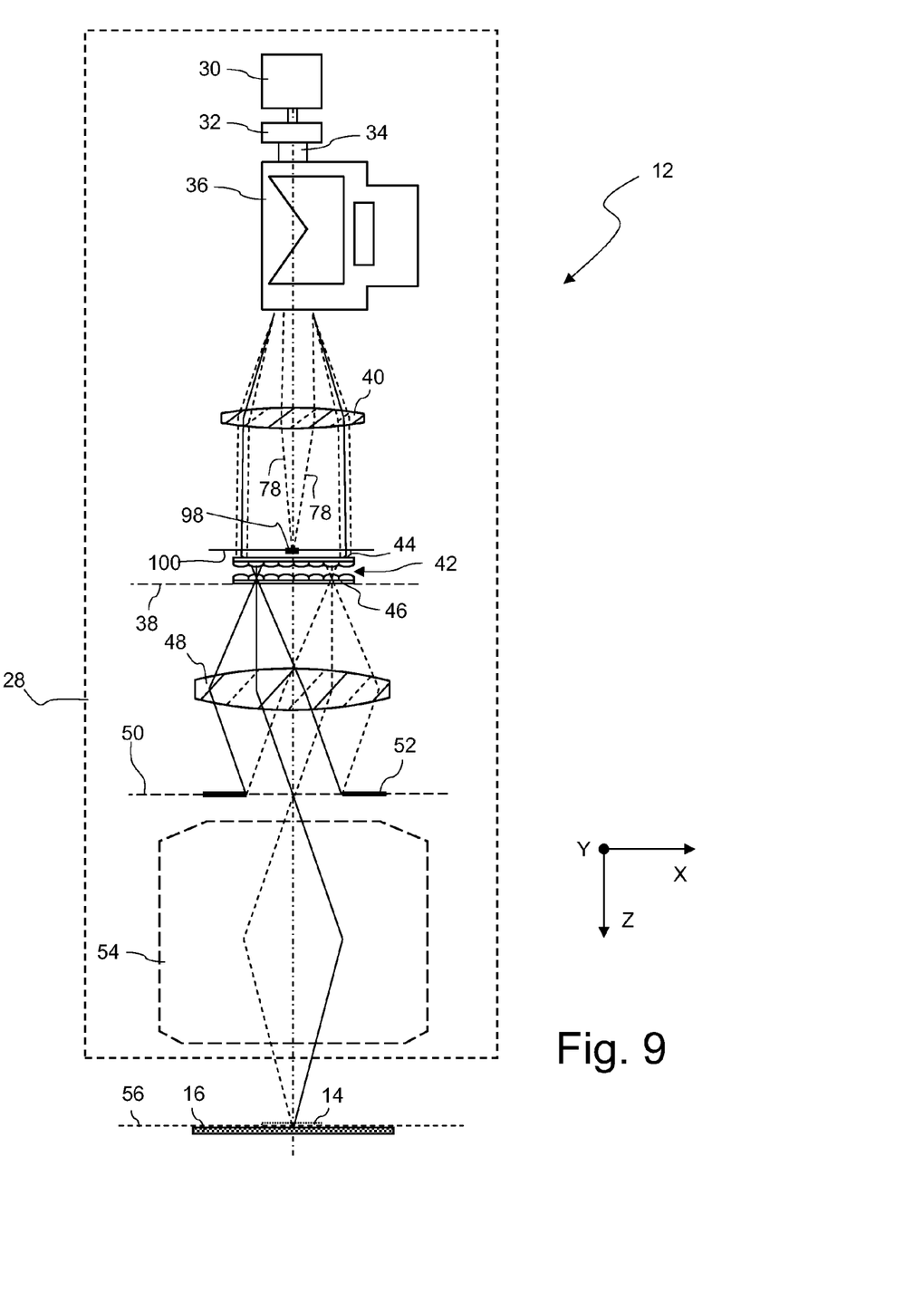
FIG. 9 is a meridional section through an illumination system according to a seventh embodiment in which a light obscurator is used to prevent that reflected light portions reach the center of the pupil surface.

FIG. 9 is a schematic meridional section similar to FIG. 2 through an illumination system 12 according to another embodiment. Also in this embodiment no measures are taken that reduce reflections at the double pass surface 76.

In FIG. 9 light portions being a result of such reflections are indicated by broken lines 78. In order to prevent that these light portions contribute to the intensity distribution in the pupil surface 38, a light obscurator 98 is arranged immediately in front of the pupil surface 38. The light obscurator 98 is configured in this embodiment as a small circular plate which absorbs all impinging projection light. The light obscurator 98 is held in a central position in the pupil surface 38 by three thin wires 100 angularly separated by 120°. The wires 98 and the obscurator 98 can be removed from the light path using an appropriate manipulator.

If the illumination system 12 shall produce an illumination setting for which the center of the pupil surface 38 has to be completely dark, the obscurator 98 is inserted into the light path so that it obstructs the light portions 78 being a result of reflections at the double pass surface 76.

If the illumination system 12 shall produce an illumination system for which also the center of the pupil surface 38 has to be illuminated, the obscurator 98 is removed from the light path. Then the light portions 78 being a result of reflections at the double pass surface 76 are allowed to contribute to the intensity distribution in the pupil surface. This contribution is computationally taken into account, and the mirror control unit 66 ensures that less mirrors 64 direct projection light into the center of the pupil surface 38 than would be if there were no light portions 78.

The obscurator 98 may include, and in particular may be completely formed by, a light intensity sensor that is configured to detect the intensity of projection light impinging on it. The output signal of the light intensity sensor may then be used to monitor the intensity of the projection light produced by the light source 30. This involves the light intensity at the position of the obscurator 98 having a known dependency from the intensity produced by the light source 30.

It is to be understood that the measures taken in the embodiments described above to suppress pupil perturbation resulting from reflections at the double pass surface can also be combined in various ways. Generally, if measures are taken to reduce reflections at the double pass surface 76, there will be still some—albeit very small—reflected light portions 78 that may ultimately reach the pupil surface 38. To completely eliminate the pupil perturbations caused by these reflected light portions, the light obscurator 98 may be inserted into the beam path for illumination settings that are completely dark pupil center.

The above description of the preferred embodiments has been given by way of example.

From the disclosure given, those skilled in the art will not only understand the disclosure and its attendant advantages, but will also find apparent various changes and modifications to the structures and methods disclosed. The applicant seeks, therefore, to cover all such changes and modifications as fall within the spirit and scope of the disclosure, as defined by the appended claims, and equivalents thereof.

What is claimed is:

1. An illumination system having a pupil surface, comprising:
    a spatial light modulator configured to vary an intensity distribution of light in the pupil surface of the illumination system, the spatial light modulator comprising an array of reflective elements configured to reflect impinging light into variable directions;
    a beam folding unit configured to direct the light toward the spatial light modulator, the beam folding unit comprising a prism having a surface on which the light impinges a first time and a second time, the first time being when the light leaves the prism and before the light is reflected by the reflective elements, the second time being when the light enters the prism after the light has been reflected by the reflective elements; and
    a pupil perturbation suppressing mechanism configured to:
        a) reduce reflections of the light when the light impinges on the surface the first time; and/or b) prevent reflections of the light when the light impinges on the surface the first time from contributing to the intensity distribution of the light in the pupil surface,
    wherein the illumination system is a microlithographic illumination system.

2. The illumination system of claim 1, wherein the pupil perturbation suppressing mechanism comprises an anti-reflective coating supported by the surface.

3. The illumination system of claim 2, wherein the pupil perturbation suppressing mechanism comprises diffractive structures supported by the surface.

4. The illumination system of claim 1, wherein the pupil perturbation suppressing mechanism comprises diffractive structures supported by the surface.

5. The illumination system of claim 4, wherein the pupil perturbation suppressing mechanism comprises a mechanism configured to ensure that an angle of incidence of the light when the light impinges the first time on the surface is the Brewster angle.

6. The illumination system of claim 3, wherein the pupil perturbation suppressing mechanism comprises a mechanism configured to ensure that an angle of incidence of the light when the light impinges the first time on the surface is the Brewster angle.

7. The illumination system of claim 2, wherein the pupil perturbation suppressing mechanism comprises a mechanism configured to ensure that an angle of incidence of the light when the light impinges the first time on the surface is the Brewster angle.

8. The illumination system of claim 1, wherein the pupil perturbation suppressing mechanism comprises a mechanism configured to ensure that an angle of incidence of the light when the light impinges the first time on the surface is the Brewster angle.

9. The illumination system of claim 8, wherein at least 80% of the light is in a p-polarization state when it impinges the first time on the surface.

10. The illumination system of claim 9, further comprising a polarizing unit configured to transform the light when it impinges on the polarizing unit from an initial state to a p-polarization state.

11. The illumination system of claim 8, further comprising a polarizing unit configured to transform the light when it impinges on the polarizing unit from an initial state to a p-polarization state.

12. The illumination system of claim 11, wherein the polarizing unit comprises:
    a half-wave plate;
    a quarter-wave plate; and
    at least two birefringent plates having a non-uniform thickness.

13. The illumination system of claim 1, wherein the pupil perturbation suppression mechanism comprises a liquid between the surface and the reflective elements.

14. The illumination system of claim 13, wherein the liquid fills a space between the surface and the reflective elements.

15. The illumination system of claim 1, wherein the prism comprises a first reflective surface and a second reflective surface, and the pupil perturbation suppression mechanism comprises a mechanism configured to ensure that the surface forms different angles with the first and second reflective surfaces so that the light portions resulting from reflections at the surface do not reach the pupil surface.

16. The illumination system of claim 1, wherein the pupil perturbation suppression mechanism comprises a mechanism configured to ensure that the surface is a distance from the spatial light modulator so that areas on the surface on which the light impinges the first time are completely separated from areas on the surface on which the light impinges the second time.

17. The illumination system of claim 1, wherein the pupil perturbation suppression mechanism comprises an obscurator insertable into a path of the light between the prism and the pupil surface at a position so that the obscurator obstructs the light portions resulting from reflections at the surface so that the reflections do not reach the pupil surface.

18. The illumination system of claim 17, wherein the obscurator comprises a light intensity sensor configured to detect the intensity of light impinging on the obscurator.

19. The illumination system of claim 1, further comprising the light source.

20. The illumination system of claim 1, wherein the directions of the light reflected by the array of reflective elements depend on control signals applied to the reflective elements.

21. An apparatus, comprising:
    an illumination system, comprising:
        a spatial light modulator configured to vary an intensity distribution of light in a pupil surface of the illumination system, the spatial light modulator comprising an array of reflective elements configured to reflect impinging light into variable directions;
        a beam folding unit configured to direct the light toward the spatial light modulator, the beam folding unit comprising a prism having a surface on which the light impinges a first time and a second time, the first time being when the light leaves the prism and before the light is reflected by the reflective elements, the second time being when the light enters the prism after the light has been reflected by the reflective elements; and a pupil perturbation suppressing mechanism configured to: a) reduce reflections of the light when the light impinges on the surface the first time; and/or b) prevent reflections of the light when the light impinges on the surface the first time from contributing to the intensity distribution of the light in the pupil surface; and a projection objective, wherein the system is a microlithographic projection exposure apparatus.

22. A method of using a microlithographic projection exposure apparatus comprising an illumination system and a projection objective, the method comprising:

using the illumination system to illuminate with light a mask having features; and using the projection objective to project at least some of the features of the mask onto a photoresist, wherein the illumination system comprises:

a spatial light modulator configured to vary an intensity distribution of the light in a pupil surface of the illumination system, the spatial light modulator comprising an array of reflective elements configured to reflect impinging light into variable directions;

a beam folding unit configured to direct the light toward the spatial light modulator, the beam folding unit comprising a prism having a surface on which the light impinges a first time and a second time, the first time being when the light leaves the prism and before the light is reflected by the reflective elements, the second time being when the light enters the prism after the light has been reflected by the reflective elements; and a pupil perturbation suppressing mechanism configured to: a) reduce reflections of the light when the light impinges on the surface the first time; and/or b) prevent reflections of the light when the light impinges on the surface the first time from contributing to the intensity distribution of the light in the pupil surface.

* * * * *